(12) United States Patent
Sharma et al.

(10) Patent No.: US 6,903,909 B2
(45) Date of Patent: Jun. 7, 2005

(54) MAGNETORESISTIVE ELEMENT INCLUDING FERROMAGNETIC SUBLAYER HAVING SMOOTHED SURFACE

(75) Inventors: Manish Sharma, Mountain View, CA (US); Janice H. Nickel, Sunnyvale, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 105 days.

(21) Appl. No.: 10/285,815

(22) Filed: Nov. 1, 2002

(65) Prior Publication Data

US 2004/0085687 A1 May 6, 2004

(51) Int. Cl.⁷ .............................. G11B 5/127; G11B 5/39
(52) U.S. Cl. .................. 360/324.2; 360/324.11
(58) Field of Search .................. 360/324.11, 324.2, 360/324.1, 324, 313, 110

(56) References Cited

U.S. PATENT DOCUMENTS

| | | | |
|---|---|---|---|
| 5,955,211 A | * | 9/1999 | Maeda et al. ............... 428/692 |
| 6,031,692 A | * | 2/2000 | Kawawake et al. ..... 360/324.12 |
| 6,181,537 B1 | | 1/2001 | Gill .......................... 360/324.2 |
| 6,205,052 B1 | * | 3/2001 | Slaughter et al. ............ 365/173 |
| 6,449,133 B1 | * | 9/2002 | Makino et al. ......... 360/324.11 |
| 6,727,105 B1 | | 4/2004 | Brug et al. ..................... 438/3 |

* cited by examiner

*Primary Examiner*—Julie Anne Watko

(57) ABSTRACT

A ferromagnetic layer of a magnetoresistive element includes a crystalline ferromagnetic sublayer and an amorphous ferromagnetic sublayer. The amorphous ferromagnetic sublayer has a smoothed surface.

16 Claims, 6 Drawing Sheets

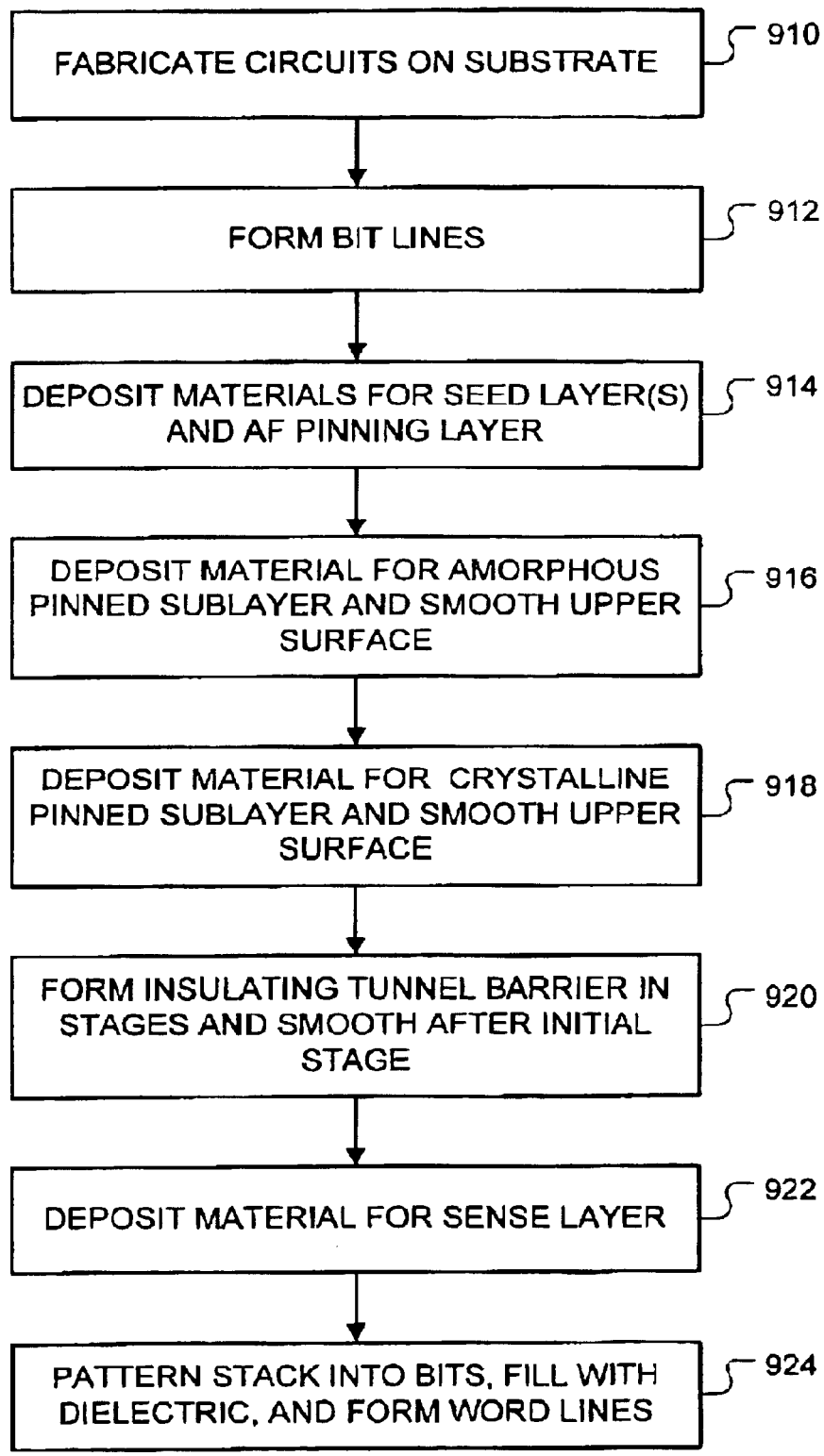

MAGNETORESISTIVE ELEMENT INCLUDING FERROMAGNETIC SUBLAYER HAVING SMOOTHED SURFACE

BACKGROUND

A conventional magnetic tunnel junction includes a pinned ferromagnetic layer, a sense ferromagnetic layer and an insulating tunnel barrier sandwiched between the ferromagnetic layers. Relative orientation and magnitude of spin polarization of the ferromagnetic layers determine the resistance of the magnetic tunnel junction. Generally, the resistance of the magnetic tunnel junction is a first value ($R_N$) if the magnetization of the sense layer points in the same direction as the pinned layer magnetization (referred to as a "parallel" magnetization orientation). The resistance is increased to a second value ($R_N + \Delta R_N$) if the magnetization orientations of the sense and pinned layers point in opposite directions (referred to as an "anti-parallel" magnetization orientation). The magnetic tunnel junction has an intermediate resistance ($R_N < R < R_N + \Delta R_N$) as the sense layer magnetization is rotated from one direction to the other.

Magnetic tunnel junctions can be used as magnetic sensors in read heads. The magnetic tunnel junction of a read head can detect data stored on a magnetic storage medium such as a hard disk drive.

Magnetic tunnel junctions can be used as memory elements in magnetic random access memory (MRAM) devices. The two magnetization orientations, parallel and anti-parallel, represent logic values of "0" and "1." A logic value may be written to a magnetic tunnel junction by setting the magnetization orientation to either parallel or anti-parallel. The orientation may be changed from parallel to anti-parallel or vice-versa by applying the proper magnetic field to the magnetic tunnel junction. The logic value may be read by sensing the resistance of the magnetic tunnel junction.

FM coupling between the pinned and sense layers can cause problems with magnetic tunnel junctions. In read heads, the FM coupling can cause readback signal distortion. Bias techniques can be used to correct the signal distortion. However, the bias techniques tend to be complex to implement and costly to fabricate.

In magnetic memory elements, the FM coupling can render magnetic tunnel junctions unusable. Unusable magnetic tunnel junctions can reduce MRAM performance, increase fabrication cost, and increase the complexity of read circuits.

SUMMARY

According to one aspect of the present invention, a ferromagnetic layer of a magnetoresistive element includes a crystalline ferromagnetic sublayer and an amorphous ferromagnetic sublayer. Other aspects and advantages of the present invention will become apparent from the following detailed description, taken in conjunction with the accompanying drawings, illustrating by way of example the principles of the present invention.

BRIEF DESCRIPTION OF THE DRAWINGS

FIG. 9 is an illustration of a method of fabricating a data storage device according to an embodiment of the present invention.

DETAILED DESCRIPTION

Figure 1:
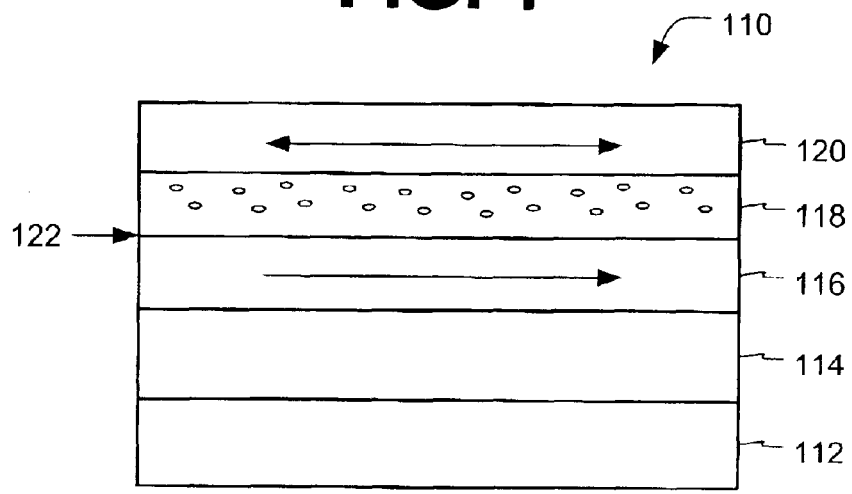
FIG. 1 is an illustration of a magnetoresistive element according to a first embodiment of the present invention.

Reference is made to FIG. 1, which illustrates a magnetoresistive element 110 including a multi-layer stack of materials. The stack includes seed layer(s) 112, an antiferromagnetic (AF) pinning layer 114, a pinned ferromagnetic (FM) layer 116, a spacer layer 118, and a sense FM layer 120. The seed layer(s) 112 provides the correct crystal orientation for the AF pinning layer 114. The AF pinning layer 114 provides a large exchange field, which holds the magnetization of the pinned layer 116 in one direction. Consequently, the pinned layer 116 has a magnetization that is oriented in a plane, but fixed so as not to rotate in the presence of an applied magnetic field in a range of interest.

The sense layer 120 has a magnetization orientation that is not pinned. Rather, its magnetization can be rotated between either of two directions: the same direction as the pinned layer magnetization, or the opposite direction as the pinned layer magnetization.

If the magnetoresistive element 110 is a magnetic tunnel junction (MTJ), the spacer layer 118 is an insulating tunnel barrier, which allows quantum mechanical tunneling to occur between the pinned and sense layers 116 and 120. This tunneling phenomenon is electron spin dependent, making the resistance across the pinned and sense layers 116 and 120 of the MTJ a function of the orientation of the sense layer magnetization.

If the magnetoresistive element 110 is a giant magnetoresistive (GMR) device, the spacer layer 118 is made of a conductive metal such as copper. In-plane resistance across the sense layer 120 of a GMR device is a function of the orientations of the sense layer magnetization.

If the magnetoresistive element is an anisotropic magnetoresistive (AMR) device, the spacer layer 118 is made of a conductive material, and a soft adjacent layer is used instead of a pinned layer. In a dual stripe AMR device, the spacer layer is made of an insulating material.

Facing surfaces of the pinned layer 116 and the spacer layer 118 define an interface 122. This interface 122 will be referred to as the "spacer interface." During deposition of the pinned layer 116, the pinned layer 116 exhibits columnar growth, which causes the grains to bow upward at the interface surface of the pinned layer 116 with large angle slope. This bowing produces magnetic poles on the edges of grains of the pinned layer 116. These poles produce a magnetic field in the sense layer 120.

Figure 2:
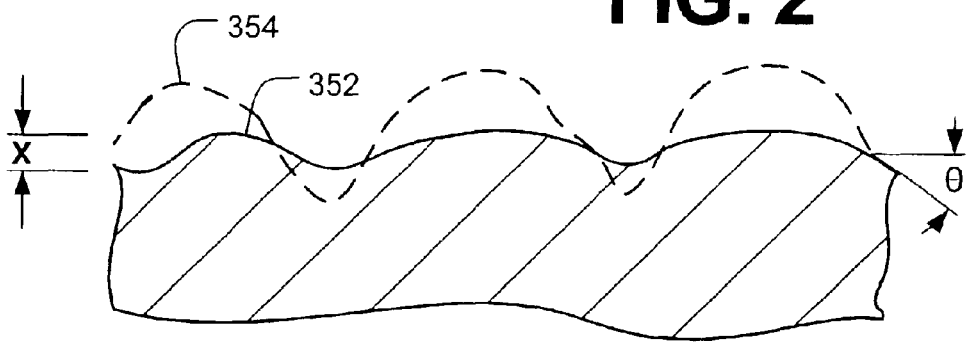
FIG. 2 is an illustration of a peak-to-valley height difference on a surface of a pinned layer of the magnetoresistive element.

Additional reference is made to FIG. 2, which illustrates the peak-to valley height variations on the interface surface of the pinned layer 116. To prevent the bowing from causing strong FM coupling between the pinned and sense layers 116 and 120, the spacer interface 122 is smoothed. The spacer interface 122 may be smoothed during fabrication by flattening peaks and filling valleys on the exposed surface of the pinned layer 116. Flattening the peaks and filling the valleys reduces the peak-to-valley height variations. The pinned layer surface after smoothing is indicated in solid lines and referenced by numeral 352, and the pinned layer surface prior to smoothing is indicated in dashed lines and referenced by numeral 354. The height variation between a flattened peak and a valley is referenced by the letter X. FIG. 2 is intended merely to illustrate the peak-to-valley height difference before and after the pinned layer surface has been smoothed; it is not intended to provide an accurate depiction of the surfaces 352 or 354 of the pinned layer 116.

Smoothing the surface 352 to a critical flatness has been found to significantly reduce or eliminate FM coupling. It has been found that a critical flatness is achieved when the peak-to-valley height difference X is no more than about one nanometer.

The smoothing decreases edge grain angles on the surface of the pinned layer 116. Shallower angles of the grains are believed to produce fewer magnetic poles at the edges. Ideally, the angle θ from the top of a grain to the intersection with an adjacent grain is between about three and six degrees.

Instead of eliminating the FM coupling, the level of FM coupling may be tuned to reduce or cancel AF coupling. As the magnetoresistive element 110 gets smaller, the AF coupling increases. Once the pinned layer 116 has been patterned, demagnetization fields emanate from its edges. Since this magnetic field tries to complete a circuit, it terminates on the sense layer 120 and thereby produces a field in the opposite direction of the pinned layer magnetization. This induced field, which is largest at the edges of the sense layer 120, causes the AF coupling. Tuning the FM coupling becomes especially valuable as the magnetoresistive element becomes smaller and the AF coupling becomes more prominent.

Smoothing the spacer interface 122 is not limited to smoothing the surface of the pinned layer 116. The magnetoresistive element 110 may include an FM interfacial layer between the pinned layer 116 and the spacer layer 118. The interfacial layer would be part of the spacer interface 122. Smoothing may be performed on the interfacial layer surface facing the spacer layer 118. Such smoothing of the spacer interface 122 may be performed in addition to, or instead of, the smoothing of the pinned layer surface 352. Smoothing the pinned layer 116 can result in a smoother interfacial layer, as well as a smoother spacer layer 118.

The spacer interface 122 may also include sublayers of the spacer layer 118. If the spacer layer 118 can be formed in sublayers (e.g., an insulating tunnel barrier that is formed over multiple deposition steps), at least one of the sublayers can be smoothed. Such smoothing of the spacer interface 122 may be performed in addition to, or instead of, the smoothing of the pinned layer surface 352. Smoothing the underlying sublayers can result in a smoother spacer layer 118.

The spacer interface 122 may be smoothed by using an ion etching process or other process that does not destroy the properties of the magnetoresistive element. The FM coupling can be reduced monotonically with ion etch time within certain ranges (the ranges depend upon the FM material). A typical ion etch rate is on the order of 1 nm/min. The ion etch time can be calibrated to allow the FM coupling to exactly compensate for the AF coupling, no matter what device size is used at the design center of the application.

The spacer interface 122 can be further smoothed by adding a layer of amorphous FM material to the magnetoresistive element. A magnetoresistive element having an amorphous FM layer is illustrated in FIG. 3.

Figure 3:
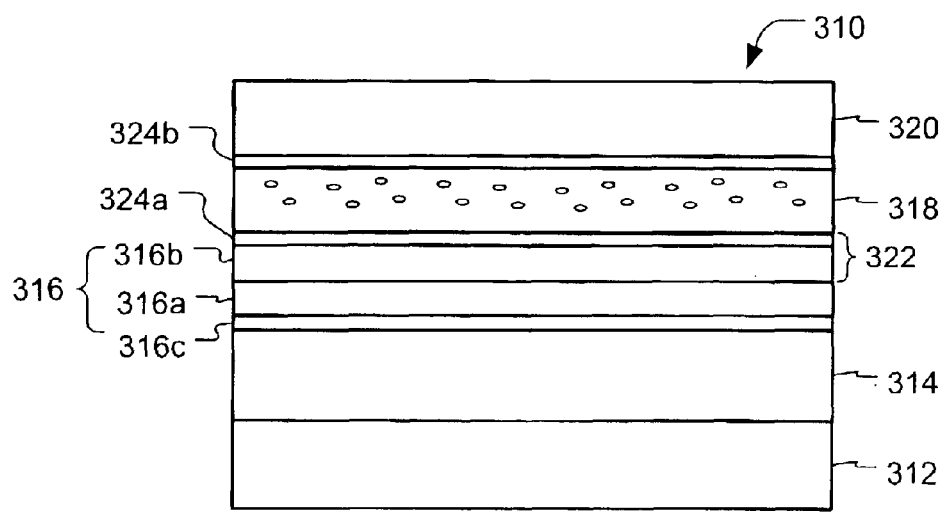
FIG. 3 is an illustration of a magnetoresistive element according to a second embodiment of the present invention.

Referring now to FIG. 3, the magnetoresistive element 310 includes seed layers 312, an AF pinning layer 314, a pinned layer 316, a spacer layer 318, and a sense layer 320. The element 310 further includes first and second interfacial FM layers 324a and 324b on opposite sides of the spacer layer 318. The pinned layer 316 includes a sublayer 316a of amorphous ferromagnetic material between sublayers 316b and 316c of crystalline ferromagnetic material (the interfacial layer 324a and the sublayer 316b may be formed as a single layer instead of separate layers). For the purpose of this application, crystalline FM material refers to both monocrystalline and polycrystalline FM material. The amorphous sublayer 316a may be an FM material (e.g., NiFe, NiFeCo alloys, CoFe) to which an amorphizing agent (e.g., B, Nb, Hf, Zr) is added. The crystalline sublayers 316b and 316c may be made of a material such as NiFe. Final thickness of these sublayers 316a, 316b and 316c may be between one and three nm.

The amorphous sublayer 316a can break the grain boundary structure at the AF pinning layer 316. This deliberate interruption of the grain structure reduces the severity of the peaks and valleys formed at the spacer interface 122. If the AF pinning layer includes a material (e.g., manganese) that can diffuse into crystalline ferromagnetic material, the amorphous sublayer 316a provides the additional advantage of blocking the diffusion.

The crystalline sublayers 316b and 316c of the pinned layer preferably have a high moment/polarization. Increasing the moment/polarization of these crystalline sublayers 316b and 316c can increase the TMR of the magnetoresistive element 310.

The pinned layer 316 may instead include only a single layer 316a of amorphous ferromagnetic material, or an amorphous sublayer 316c and a single crystalline sublayer 316b. However, eliminating one or both of the crystalline sublayers 316b, 316c would weaken the pinning field (reducing the crystallinity would reduce the pinning field) in addition to reducing the TMR of the magnetoresistive element 310.

The upper surface of the amorphous sublayer 316a and the lower surface of the insulating tunnel barrier 318 define a spacer interface 322. The interface may be smoothed by smoothing the upper surfaces of at least one of the following layers: the amorphous sublayer 316a, the crystalline sublayer 316b, and the interfacial layer 324a. The spacer layer interface 322 may also be smoothed by smoothing the lower surface of the insulating tunnel 318.

As an alternative, none of these surfaces are smoothed. However, smoothing the surface of the amorphous sublayer 316a improves the gain structure of the overlaying crystalline sublayer 316b. Moreover, smoothing any of these surfaces further reduces FM coupling or allows the FM coupling to be tuned.

The magnetoresistive elements just described are not limited to any particular application. Two exemplary applications will now be described: a hard disk drive, and an MRAM device.

Figure 4:
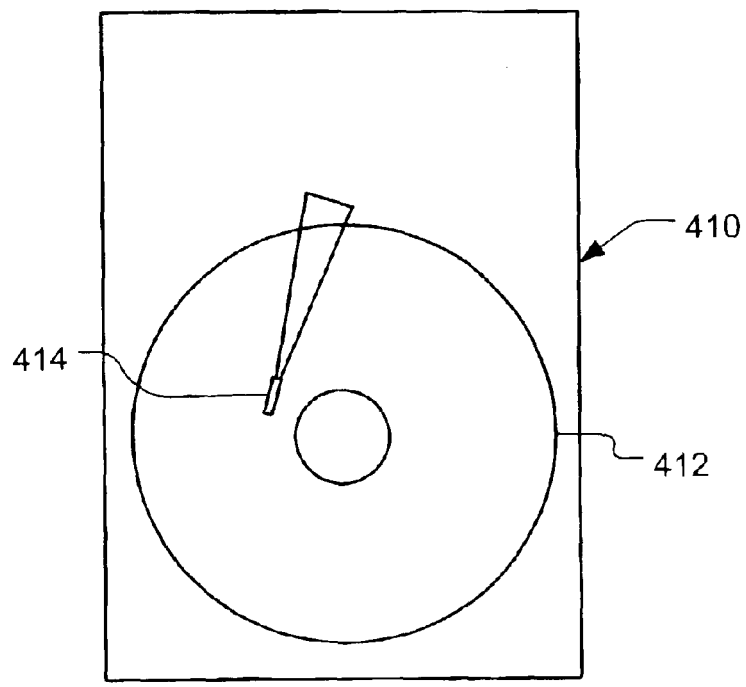
FIG. 4 is an illustration of a hard disk drive including a magnetoresistive read head according to an embodiment of the present invention.

Reference is now made to FIG. 4, which shows a hard disk drive 410 including magnetic media disks 412. User data is stored in concentric circular tracks on the surface of each disk 412. The disk drive 410 also includes transducers 414 for performing read and write operations on the disks 412. Each transducer 414 includes a magnetoresistive read head for the read operations (each transducer 414 may also include a thin film inductive head for the write operations).

Figure 5:
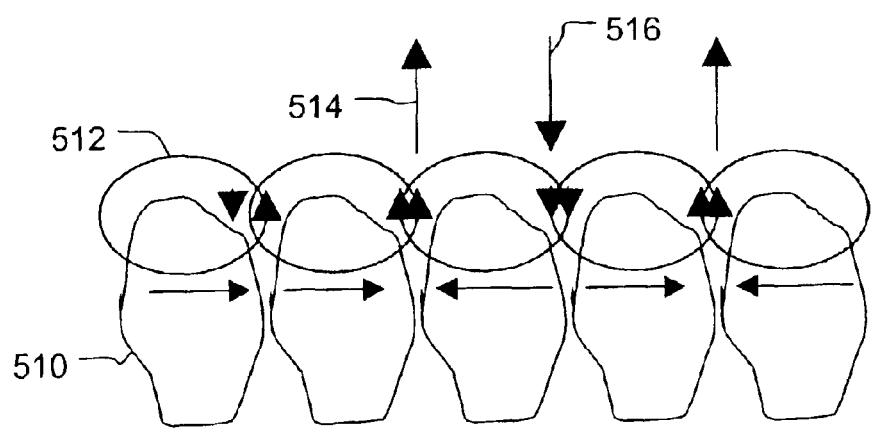
FIG. 5 is an illustration of magnetized regions on a hard disk of the disk drive.

Additional reference is made to FIG. 5. During read operations, magnetized regions 510 of the disk are passed under the read head of the transducer 414. The read head detects transitions in the magnetized regions 510. Fringe fields 512 emanate from the grains at the grain boundaries. Three net magnetization states occur: where the fringe fields add out of the plane of the disk 412 (the net field is indicated by arrow 514); where the fringe fields add into the plane of the disk 412 (the net field is indicated by an arrow 516); and where the fringe fields cancel out (no net field and, therefore, no arrow). The net fields 514 adding out of the disk 412 cause the sense layer magnetization to rotate toward one direction, and the net fields 516 adding into the disk 412 cause the sense layer magnetization to rotate toward the other direction.

The read head generates a readback signal during detection of the net fields. Amplitude of the readback signal depends upon the magnetoresistance of the read head. The smoothing can be controlled to adjust the position of the transfer curve so that the amplitude is linearly related to the read head resistance. This, in turn, reduces readback signal distortion during read operations.

Figure 6:
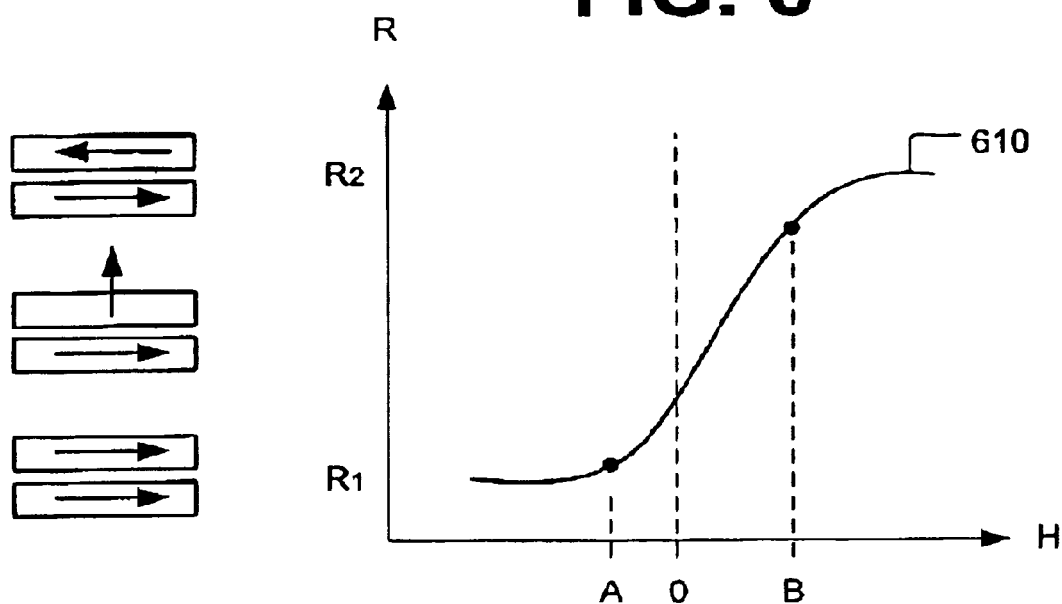
FIG. 6 is an illustration of a transfer curve for the magnetoresistive read head.

Additional reference is made to FIG. 6, which illustrates a transfer curve 610 for the read head. The transfer curve 610 has a region that is roughly linear between points A and B. It may be desirable to center this linear region about a zero magnetic field (H=0). The magnetic tunnel junction has a nominal resistance (R1=$R_N$) when the magnetization of the pinned and sense layers 116 and 120 are in the same direction. The magnetic tunnel junction has a higher resistance (R2=$R_N$+$\Delta R_N$) when the magnetization of the pinned and sense layers 116 and 120 are in opposite directions. The magnetic tunnel junction has an intermediate resistance (R1<R<R2) as the sense layer magnetization is rotated from one direction to the other.

The FM coupling can be tuned to improve the centering of the transfer curve 610 about the zero magnetic field. The AF coupling tends to move the transfer curve 610 toward the left in FIG. 6, such that the resistance of the magnetoresistive element 110 at zero field is a high resistance state.

Smoothing can provide advantages other than adjusting magnetic coupling. In the case of a magnetic tunnel junction, the insulating tunnel barrier is distributed more evenly over the pinned layer. Distributing the barrier material more evenly allows the thickness of the insulating tunnel barrier to be reduced without creating pinholes (the pinholes greatly increase magnetic coupling and short the junctions). Reducing the barrier thickness, in turn, reduces the resistance of the read head, which reduces the RC constant of the read head. Consequently, response time of the read head is faster. Reducing the resistance of the read head can also reduce power consumption.

Smoothing the spacer interface can also improve the uniformity of read head resistance. Read head uniformity simplifies read head design, and reduces the need to tune the disk drives for read head properties. Smoothing the interface can also reduce the number of shorted read heads and thereby improve manufacturing yield.

Amorphous FM material only may be used in the pinned layer. However, adding the crystalline FM material to the pinned layer will increase signal strength.

The magnetoresistive elements are not limited to longitudinal recording, as illustrated in FIG. 5. The magnetoresistive elements may be used for perpendicular recording, in which magnetic fields from grains are measured.

Figure 7:
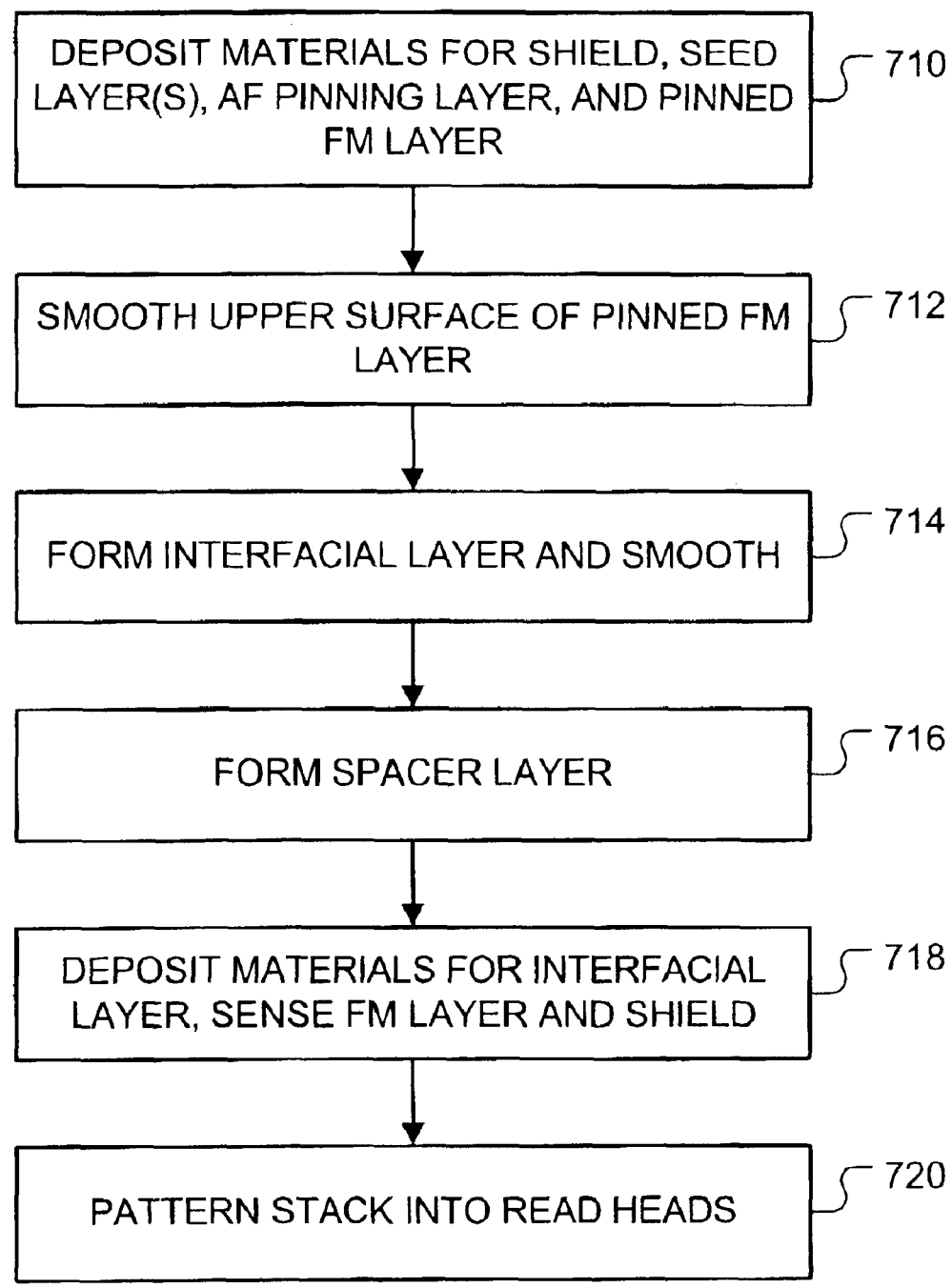
FIG. 7 is an illustration of a method of fabricating a magnetoresistive read head according to an embodiment of the present invention.

Reference is now made to FIG. 7, which illustrates an exemplary method of fabricating a plurality of read heads. A stack of the following materials is deposited on a wafer: shield material, seed layer material, AF pinning layer material, and pinned FM layer material (710). The thickness of the deposited pinned layer material is increased to compensate for the ion etching that follows.

The upper, exposed surface of the pinned layer is ion etched to a critical flatness (block 712). The ion etching may be performed by bombarding the pinned layer with argon ions or any other non-reactive ions. The ion etch may be performed in-situ in a deposition chamber. The FM coupling can be reduced monotonically with ion etch time within a particular range (the range depends upon the material). This permits adjustment of the magnetic interactions such that the read head operates linearly.

Interfacial layer material is then deposited on the etched surface, and an upper surface of the interfacial layer material is ion etched (714). Insulating tunnel barrier material is then deposited (716). A barrier material such as $Al_2O_3$, for example, may be formed by r-f sputtering, or by depositing aluminum and then oxidizing the aluminum by a process such as plasma oxidation.

Interfacial layer material, sense layer material, and shield material are then deposited (718). An isolation dielectric layer is formed between the sense layer material and the shield for GMR and AMR devices. The resulting stack is then patterned into a plurality of read heads (block 720).

The shield material may be an electrically conductive and magnetically permeable material such as NiFe. The seed layer material may be any material that establishes the desired grain orientation of the AF pinning layer. Candidate materials for the seed layer(s) include titanium (Ti), tantalum (Ta), and platinum (Pt). Candidate materials for the AF pinning layer 36 include platinum-manganese (PtMn), manganese-iron (MnFe), nickel manganese (NiMn), and iridium-manganese (IrMn). Candidate materials for the insulating tunnel barrier include aluminum oxide ($Al_2O_3$), silicon dioxide ($SiO_2$), tantalum oxide ($Ta_2O_5$), silicon nitride ($SiN_4$), other dielectrics, and certain semiconducting materials. Candidate materials for the pinned and sense layers and include NiFe, iron oxide ($Fe_3O_4$), chromium oxide ($CrO_2$), alloys of any of Ni, Fe and Co (e.g., CoFe, NiCoFe), and other ferromagnetic and ferrimagnetic materials.

Figure 8:
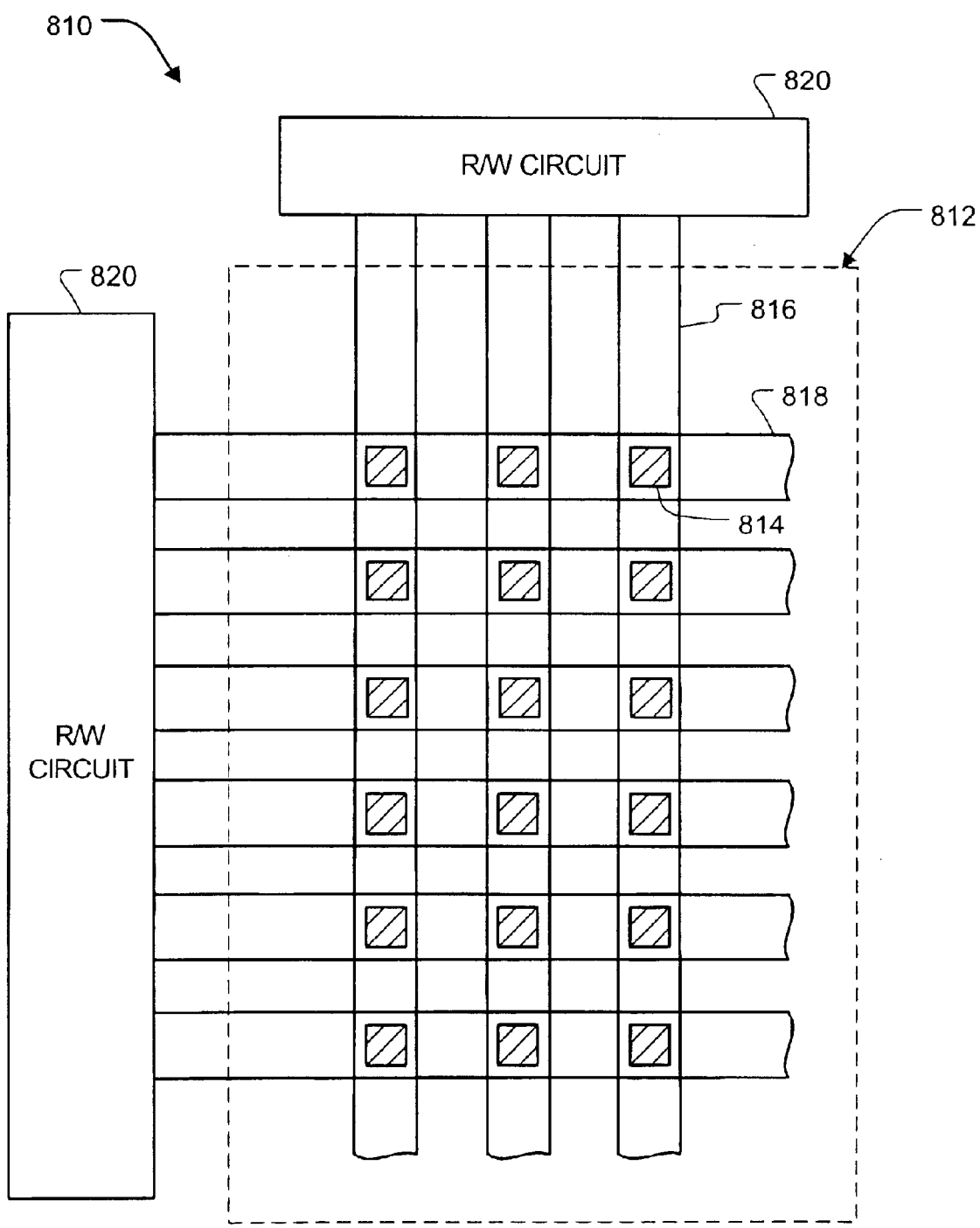
FIG. 8 is an illustration of a data storage device including magnetoresistive memory elements according to an embodiment of the present invention.

Reference is now made to FIG. 8, which shows an exemplary MRAM device 810 including an array 812 of memory cells 814. Each memory cell 814 may include one or more magnetoresistive elements. Only a relatively small number of magnetoresistive elements 814 are shown to simplify the description of the MRAM device 810. In practice, arrays 812 of any size may be used.

Word lines 816 extend along rows of the memory cells 814, and bit lines 818 extend along columns of the memory cells 814. There may be one word line 816 for each row of the array 812 and one bit line 818 for each column of the array 812. Each memory cell 814 is located at a cross point of a word line 816 and bit line 818.

The MRAM device 810 also includes a read/write circuit 820 for performing read and write operations on selected memory cells 814. The read/write circuit 820 senses resistance of selected memory cells 814 during read operations, and it orients the magnetization of the selected memory cells 814 during write operations.

FIG. 9 shows a method of manufacturing the MRAM device. The read/write circuit and other circuits are fabricated on a substrate (block 910). Conductor material is then deposited onto the substrate and patterned into bit lines (block 912). A dielectric may then be deposited between the bit lines. Materials for the seed layer(s), and the AF pinning layer are deposited (block 914).

Pinned layer material is then deposited. Material for an amorphous FM sublayer is deposited, and an upper, exposed surface is ion etched to a critical flatness (block 916). Material for a crystalline FM sublayer is deposited, and an upper, exposed surface is ion etched to a critical flatness (block 918). Ion etching the upper surface of the amorphous layer can improve grain structure of the crystalline sublayer. The thickness of the deposited material is increased to compensate for the ion etching.

Insulating tunnel barrier material is formed on the etched material (block 920). A barrier material such as $Al_2O_3$, for example, may be deposited by r-f sputtering, or by depositing aluminum and then oxidizing the aluminum by a process such as plasma oxidation. If the insulating tunnel barrier material is formed in multiple stages, at least one stage may be ion etched.

Material for the sense FM layer is then deposited (block 922). The resulting stack is then patterned into bits, and spaces between the bits are filled with dielectric (block 924). Conductor material is then deposited on the dielectric and patterned into word lines (block 924).

The resulting array may then be planarized. A new array may be formed atop the planarized array.

FIG. 9 describes the manufacture of a single MRAM device. In practice, however, many MRAM devices will be fabricated simultaneously on a single wafer.

Figure 10:
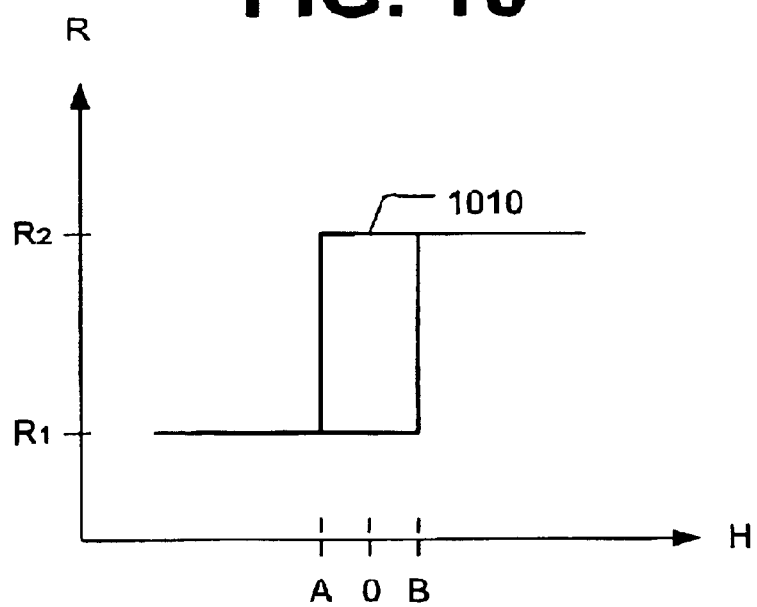
FIG. 10 is an illustration of a response curve for the magnetoresistive memory element.

Reference is made to FIG. 10, which illustrates a response curve 1010 for a magnetoresistive element of the MRAM device. The smoothing can be performed to adjust the position of the response curve and improve the uniformity of switching across the array. The switching points A and B may be centered about a zero magnetic field. Improving the switching uniformity can reduce the number of magnetic tunnel junctions that are not switched in the presence of a sufficient magnetic field, and that are inadvertently switched even though the magnetic field is not sufficient. Thus, the smoothing reduces the number of unusable magnetic tunnel junctions.

The smoothing further reduces the number of unusable tunnel junctions by reducing the number of magnetic tunnel junctions that are shorted due to pinholes.

Reducing the number of unusable magnetic tunnel junctions can increase the storage capacity of the MRAM device. It can also reduce the burden on error correction. Consequently, reducing the number of unusable magnetic tunnel junctions can improve MRAM performance and reduce fabrication cost.

The smoothing can increase uniformity of the tunnel junction resistance across the array. Increasing the uniformity can reduce the complexity of reading selected memory cells among multiple columns of memory cells.

The amorphous ferromagnetic sublayer can further reduce interface roughness. If the antiferromagnetic pinning layer includes manganese, the amorphous sublayer can also block diffusion of the manganese into the crystalline ferromagnetic layer.

Although the memory cells were described as each having only a single magnetoresistive device, the MRAM device is not so limited. Each memory cell may include more than one magnetoresistive device.

The memory cells are not limited to magnetoresistive devices such as magnetic tunnel junctions. Other magnetoresistive devices may be used.

The present invention is not limited to the magnetoresistive elements described above. Any ferromagnetic layer (pinned or unpinned, crystalline or amorphous) of a magnetoresistive element may be replaced with the combination of crystalline and amorphous ferromagnetic sublayers.

The AF pinning layer may be placed near the top of the stack instead of the bottom of the stack, whereby the pinned layer is deposited after the sense layer. If the sense layer material is deposited before the pinned layer material, the sense layer would have an interface surface having peaks and valleys. Thus the interface surface of the sense layer would be smoothed.

The present invention is not limited to the specific embodiments described and illustrated above. Instead, the present invention is construed according to the claims that follow.

What is claimed is:

1. A magnetoresistive element comprising:
   a pinned ferromagnetic layer;
   a sense ferromagnetic layer; and
   a spacer layer between the ferromagnetic layers;
   the pinned layer including an amorphous sublayer and a crystalline sublayer, the crystalline sublayer between the amorphous sublayer and the spacer layer, the amorphous sublayer having a smoothed surface.

2. The element of claim 1, wherein the smoothed surface has a valley-to-peak height difference of no more than about one nanometer.

3. The element of claim 2, wherein angle from the top of a grain to an intersection with an adjacent grain is between about three and six degrees.

4. The element of claim 1 wherein the pinned layer further includes a second crystalline ferromagnetic sublayer, the amorphous ferromagnetic layer sandwiched between the two crystalline ferromagnetic sublayers.

5. The element of claim 1, further comprising an antiferromagnetic pinning layer including manganese; wherein the pinned layer is on the antiferromagnetic layer; and wherein the pinned layer is smoothed to adjust antiferromagnetic coupling between the antiferromagnetic and pinned layers.

6. A read head for a data storage device, the read head comprising the element recited in claim 1.

7. A data storage device comprising an array of memory cells, each memory cell including at least one element recited in claim 1.

8. A method of fabricating the element recited in claim 1, the method comprising:
   depositing the amorphous ferromagnetic sublayer;
   ion etching an exposed surface of the amorphous ferromagnetic sublayer to a critical flatness; and
   depositing the crystalline ferromagnetic sublayer on the Ion etched surface of the amorphous ferromagnetic layer.

9. The element of claim 1, wherein the smoothed surface of the amorphous sublayer has a critical flatness.

10. The element of claim 1, wherein the surface of the amorphous sublayer is smoothed to improve grain structure of the sense ferromagnetic layer.

11. The element of claim 1, wherein the pinned layer is smoothed to reduce ferromagnetic coupling.

12. A ferromagnetic layer for a magnetoresistive device, the layer comprising:

an amorphous ferromagnetic sublayer having a surface with a critical flatness; and a second sublayer of a ferromagnetic material having a polarization and magnetic moment that are higher than the polarization and magnetic moment of the amorphous sublayer, the second sublayer on the surface with a critical flatness.

13. The layer of claim 12, wherein a surface of the second sublayer is smoothed.

14. The layer of claim 13, wherein the surface of the second sublayer is smoothed to a valley-to-peak height difference of no more than about one nanometer.

15. The layer of claim 10, wherein the ferromagnetic layer is a pinned layer.

16. The layer of claim 12, further comprising a third sublayer the third sublayer having a polarization and magnetic moment that are higher than the polarization and magnetic moment of the amorphous sublayer, the amorphous ferromagnetic sublayer sandwiched between the second and third sublayers.

* * * * *